(12) United States Patent
Choi

(10) Patent No.: US 6,501,687 B2
(45) Date of Patent: Dec. 31, 2002

(54) BITLINE PULL-UP CIRCUIT FOR COMPENSATING LEAKAGE CURRENT

(75) Inventor: Jung Kyun Choi, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/022,514

(22) Filed: Dec. 20, 2001

(65) Prior Publication Data

US 2002/0075729 A1 Jun. 20, 2002

(30) Foreign Application Priority Data

Dec. 20, 2000 (KR) .......................................... P00-79270

(51) Int. Cl.[7] .............................. G11C 7/00; G11C 11/24
(52) U.S. Cl. .............................. 365/189.11; 365/189.08; 365/149; 365/203
(58) Field of Search ........................... 365/189.11, 203, 365/149, 189.08

(56) References Cited

U.S. PATENT DOCUMENTS

| | | | | |
|---|---|---|---|---|
| 4,661,927 A | * | 4/1987 | Graebel | ...................... 365/105 |
| 5,163,428 A | * | 11/1992 | Pless | .......................... 128/908 |
| 5,414,663 A | * | 5/1995 | Komarek et al. | ...... 365/189.01 |
| 5,650,979 A | * | 7/1997 | Komarek et al. | ...... 365/189.08 |
| 5,748,530 A | * | 5/1998 | Gotou et al. | ........... 365/185.18 |
| 5,835,414 A | * | 11/1998 | Hung et al. | ............ 365/185.12 |
| 5,999,451 A | * | 12/1999 | Lin et al. | ............... 365/185.11 |
| 6,314,028 B1 | * | 11/2001 | Kono | .................... 365/189.09 |
| 2001/0034093 A1 | * | 10/2001 | Matsuzaki et al. | .......... 438/199 |

* cited by examiner

Primary Examiner—David Nelms
Assistant Examiner—Ly Duy Pham
(74) Attorney, Agent, or Firm—Morgan, Lewis & Bockius LLP

(57) ABSTRACT

A bitline pull-up circuit for compensating a leakage current, having one pair of bitline pull-up transistors and one bitline equalizing transistor, includes a leakage current sensing part having ends respectively connected to a bitline and the pull-up transistors, a leakage current compensating part having ends respectively connected to the bitline, a leakage current compensation control part connected to the leakage current compensating part and a first power source for controlling power supply to the leakage current compensating part, and a leakage current storing part connected to a control terminal of the leakage current compensating part and a second power source for storing a leakage current from the bitline and controlling the leakage current compensating part according to an amount of a stored leakage current.

12 Claims, 4 Drawing Sheets

BITLINE PULL-UP CIRCUIT FOR COMPENSATING LEAKAGE CURRENT

The present invention claims the benefit of Korean Patent Application No. P2000-79270 filed in Korea on Dec. 20, 2000, which is hereby incorporated by reference.

BACKGROUND OF THE INVENTION

1. Field of the Invention

The present invention relates to a bitline pull-up circuit in a semiconductor memory, and more particularly, to a bitline pull-up circuit for compensating a leakage current, in which the leakage current from a bitline is compensated for making a memory operable at a low voltage.

2. Discussion of the Related Art

In general, a precharge cycle is provided next to a read/write cycle in making access to a memory cell, for bringing levels of a bitline and a bitbarline, which become to have a great difference, to an equal level, for which a bitline pull-up circuit is employed. However, in a memory operative at a voltage below 1.5V, and processed by a technique that can process a line below 0.18 μm, though it is required to drop a threshold voltage Vth as far as possible, the threshold voltage Vth can not be dropped below a certain level because the leakage current from the bitline becomes too great if the threshold voltage Vth is dropped below the certain level.

That is, referring to FIG. 1, a related art bitline pull-up circuit is provided with an equalizing PMOS transistor Pe connected between one pair of bitline BL and the bitbarline $\overline{BL}$, and one pair of pull-up PMOS transistors Pp and PpB at opposite ends of the equalizing PMOS transistor each having one end with a power source voltage applied thereto, wherein each of the equalizing PMOS transistor Pe, and the one pair of pull-up PMOS transistors Pp and PpB has a gate having an external signal eqb or pub, applied thereto.

FIG. 3 illustrates waveforms of the signals eqb and pub. The foregoing related art bitline pull-up circuit receives the equalizing signal eqb and the pull-up signal pub as shown in FIG. 3 during a precharge cycle period from an outside of the circuit, to drive the equalizing PMOS transistor Pe, the pull-up PMOS transistors Pp and Ppb, for carrying out equalizing and pulling up operation. In an ideal case where there is no leakage current, since a voltage difference between the bitline BL and the bitbarline $\overline{BL}$ detected at a read cycle period before and after the pull-up and equalizing is great, the sense amplifier for sensing the bitline $\overline{BL}$ and the bitbarline $\overline{BL}$ is operative regularly.

However, in order to minimize power consumption, a voltage of a power source of a mobile station is dropped to the maximum, requiring to drop power source voltages of devices employed in the mobile station, too. The drop of the power source voltage requires a drop of the threshold voltage Vth of the device, that results in a greater leakage current of the device. Particularly, though a low power SRAM, operative at a voltage in a range of 1V, is required to drop the threshold voltage Vth to the maximum for smooth operation of the device, the threshold voltage of the SRAM can not be dropped to a desired level because the leakage current increases sharply when the threshold voltage reaches below a certain level.

The leakage current causes a serious problem in the bitline of the SRAM; if the leakage current from the bitline is great as shown in FIG. 3, a voltage difference V$\overline{BL}$ between the bitlines BL and the bitbarline $\overline{BL}$ is reduced, such that the sense amplifier requires a more time period for sensing the voltages of the bitline $\overline{BL}$ and the bitbarline YL with a speed delay, to cause malfunction of the sense amplifier in a worst case, to cause a trouble of the device itself.

SUMMARY OF THE INVENTION

Accordingly, the present invention is directed to a bitline pull-up circuit for compensating a leakage current that substantially obviates one or more of the problems due to limitations and disadvantages of the related art.

An object of the present invention is to provide a bitline pull-up circuit for compensating a leakage current, in which the leakage from the bitline is compensated for preventing a speed delay caused by an increased sensing time period, or malfunction of a sense amplifier in driving a low power semiconductor memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a bitline pull-up circuit for compensating a leakage current includes one pair of bitline pull-up transistors, one bitline equalizing transistor, a leakage current sensing part having ends respectively connected to a bitline and the pull-up transistors, a leakage current compensating part having ends respectively connected to the bitline, a leakage current compensation control part connected to the leakage current compensating part and a first power source, for controlling power supply to the leakage current compensating part, and a leakage current storing part connected to a control terminal of the leakage current compensating part and a second power source for storing a leakage current from the bitline, and controlling the leakage current compensating part according to an amount of a stored leakage current.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
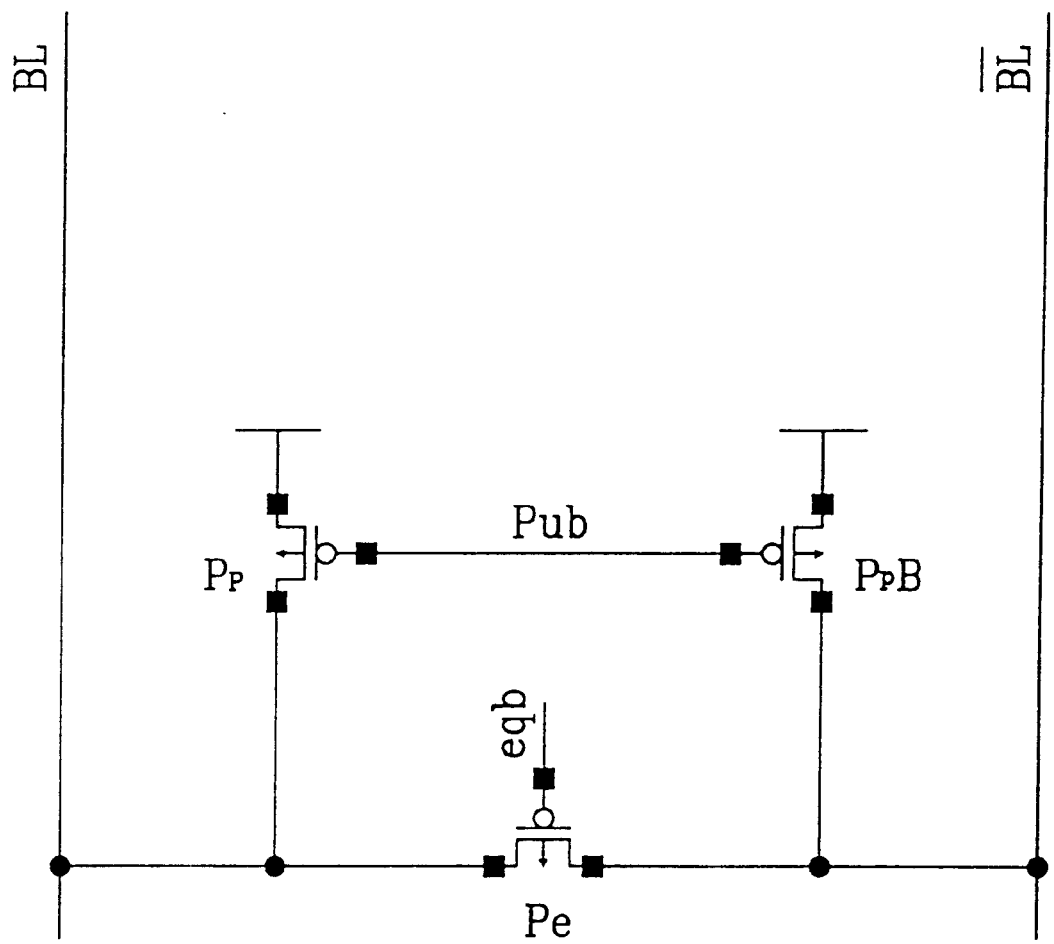
FIG. 1 illustrates a system of a related art bitline pull-up circuit, schematically.
Figure 2:
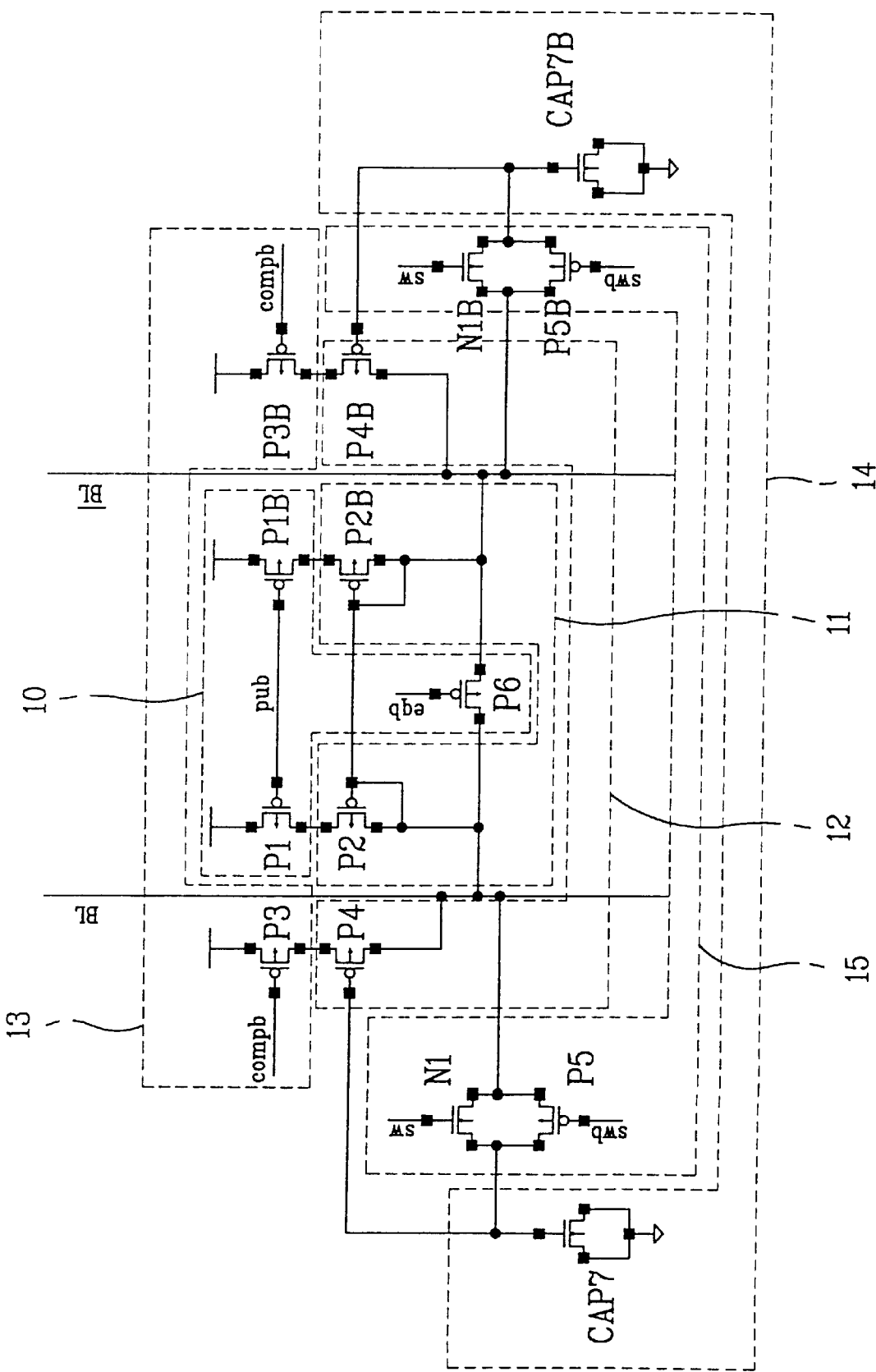
FIG. 2 illustrates a bitline pull-up circuit for compensating a leakage current in accordance with a preferred embodiment of the present invention.

Reference will now be made in detail to the preferred embodiment of the present invention, examples of which are illustrated in the accompanying drawings. FIG. 2 illustrates a bitline pull-up circuit for compensating a leakage current in accordance with the present invention, wherein it is noted that the bitline pull-up circuit shows only one pair of bitlines BL and $\overline{BL}$, and a pull-up and equalizing circuit and a leakage current compensating circuit connected to the pair of bitlines BL and $\overline{BL}$, from a matrix of memory for simplicity.

Referring to FIG. 2, the bitline pull-up circuit for compensating a leakage current in accordance with a preferred embodiment of the present invention includes a pull-up and equalizing circuit 10 having an equalizing PMOS transistor P6 connected to the pair of bitlines BL and $\overline{BL}$, and pull-up PMOS transistors P1 and P1B connected to a PMOS transistor P6, and the bitline BL or $\overline{BL}$ respectively, a leakage current sensing part 11 having PMOS transistors each with a gate and a drain connected in common, and ends respectively connected to the bitline BL or $\overline{BL}$, and the pull-up PMOS transistors P1 and P1B, a leakage current compensating part 12 having PMOS transistors P4 and P4B, and ends respectively connected to the bitline BL or $\overline{BL}$, a leakage current compensation control part 13 having PMOS transistors P3 and P3B respectively connected to the PMOS transistor P4 or P4B in the leakage current compensating part 12 and a first power source Vcc, for controlling power supply to the leakage current compensating part 12, a leakage current storing part 14 having capacitor means CAP7 and CAP7B each with one end connected to a gate of the PMOS transistor P4 or P4B, a control terminal of the leakage current compensating part 12, and the other end connected to a ground terminal, for storing a leakage current from the bitline BL, or $\overline{BL}$, and being controlled according to an amount of stored leakage current, a leakage current storing control part 15 having PMOS transistors P5 and P5B, and NMOS transistors N1 and N1B, both of which are switching means, connected to the bitline BL or $\overline{BL}$, and the capacitor means CAP7 and CAP7B in the leakage current storing part 14.

Figure 4:
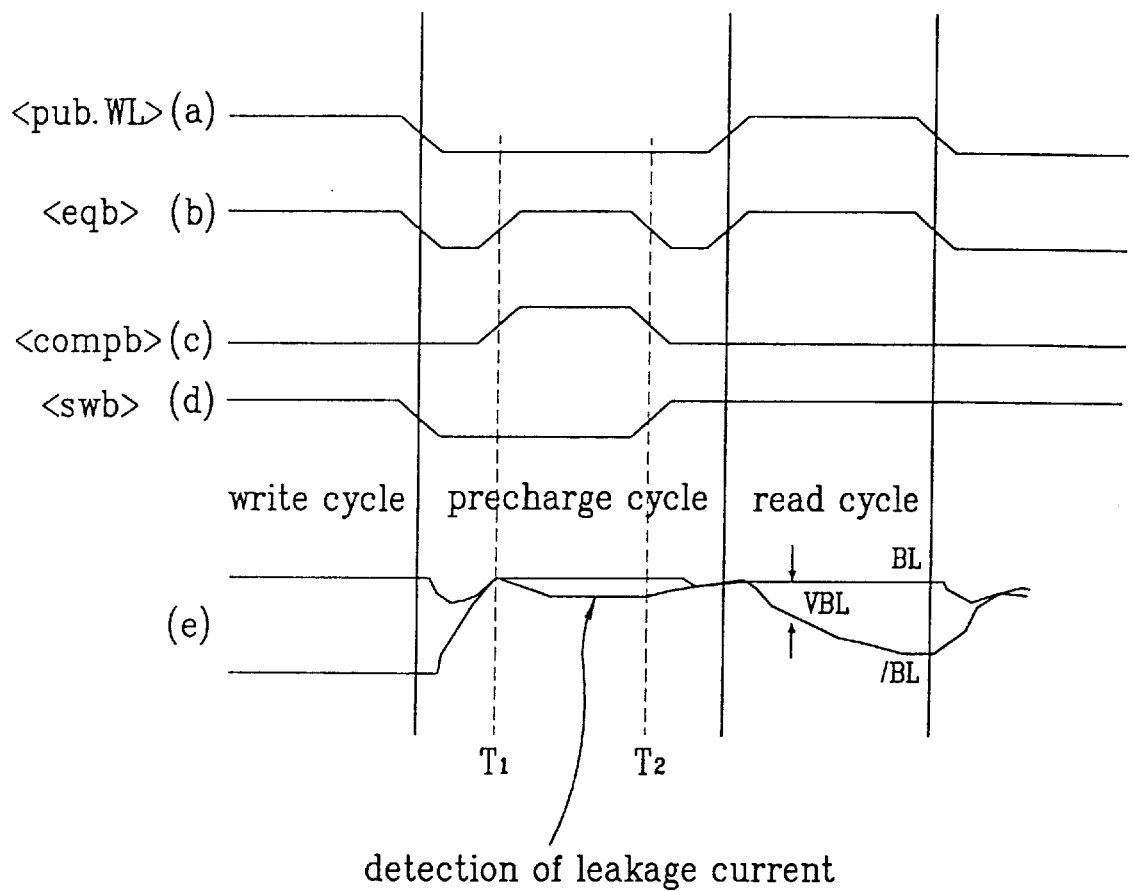
FIG. 4 illustrates waveforms of control signals applied to the bitline pull-up circuit in accordance with the preferred embodiment of the present invention, and waveforms of a bitline in respective operation cycles in the bitline pull-up circuit.

The capacitor means in the leakage current storing part 14 has a drain and a source connected in common to a ground terminal, and a gate connected both to the leakage current compensating part 12, and the leakage current storing control part 15. Each of the PMOS transistors P3 and P3B in the leakage current compensation control part 13 has a gate with an external signal Compb as shown in FIG. 4 applied thereto. The PMOS transistors P5 and P5B, and the NMOS transistors N1 and N1B in the leakage current storing control part 15, both of which are switching means, have drains and sources connected in common to the leakage current storing part 14 and the bitline BL or $\overline{BL}$, and gates having external control signals swb or sw as shown in FIG. 4 applied thereto, respectively.

The operation of the foregoing bitline pull-up circuit for compensating a leakage current will be explained, with reference to FIGS. 3 and 4.

In a precharge cycle, pub, eqb, compb, and swb as shown in FIG. 4 are applied. In this instance, it is noted that, though the eqb, an equalizing control signal, is at a low level in the precharge cycle in FIG. 3, the eqb is at a high level for a preset time period in the precharge cycle in this embodiment after the bitlines BL and $\overline{BL}$ are substantially equalized, for sensing a leakage current in the bitlines.

Referring to FIGS. 3 and 4 again, since control signals as shown in FIG. 4 are applied in the precharge cycle, to drive the pull-up transistors P1 and P1B and the equalizing transistor P6 in the pull-up and equalizing circuit 11, there is a time point T1 when potentials of the bitlines BL and $\overline{BL}$ are equal, substantially. If both of the control signals eqb and compb are made to be at a high level at this time point T1, the equalizing PMOS transistor P6 in the pull-up and equalizing circuit 10 stops operation, and, on the same time, the leakage current sensing part 11 senses a voltage difference VBL caused by the leakage current as shown in FIG. 4 because currents pulled-up through the PMOS transistors P2 and P2B in the leakage current sensing part 11 differ according to voltage drops in the bitlines BL and $\overline{BL}$, that comes from leakage currents from the bitlines BL and $\overline{BL}$.

In the meantime, since the control signal swb is at a low level as shown in FIG. 4 at the time of starting the pre-charge cycle, to make the PMOS transistors P5 and P5B, and the NMOS transistors N1 and N1B, both of which are switching means, in the leakage current storing control part 15 conductive at the time point T1 the bitlines BL and $\overline{BL}$ start equalizing, and reach to a point when voltages of the bitlines BL and $\overline{BL}$ are substantially equal, to discharge all the leakage current stored in the bitlines BL and $\overline{BL}$ before the time point T1 to initialize the bitlines BL and $\overline{BL}$, that makes compb and eqb to be at high levels simultaneously at the time point T1 (when the leakage current storing control part 15 is still conductive) stopping operation of the PMOS transistors P3 and P3B in the leakage current compensating part 13, only net leakage current is stored in the capacitor means CAP7 and CAP7B in the leakage current storing part 14 until a time point T2 through the leakage current storing control part 15.

Figure 3:
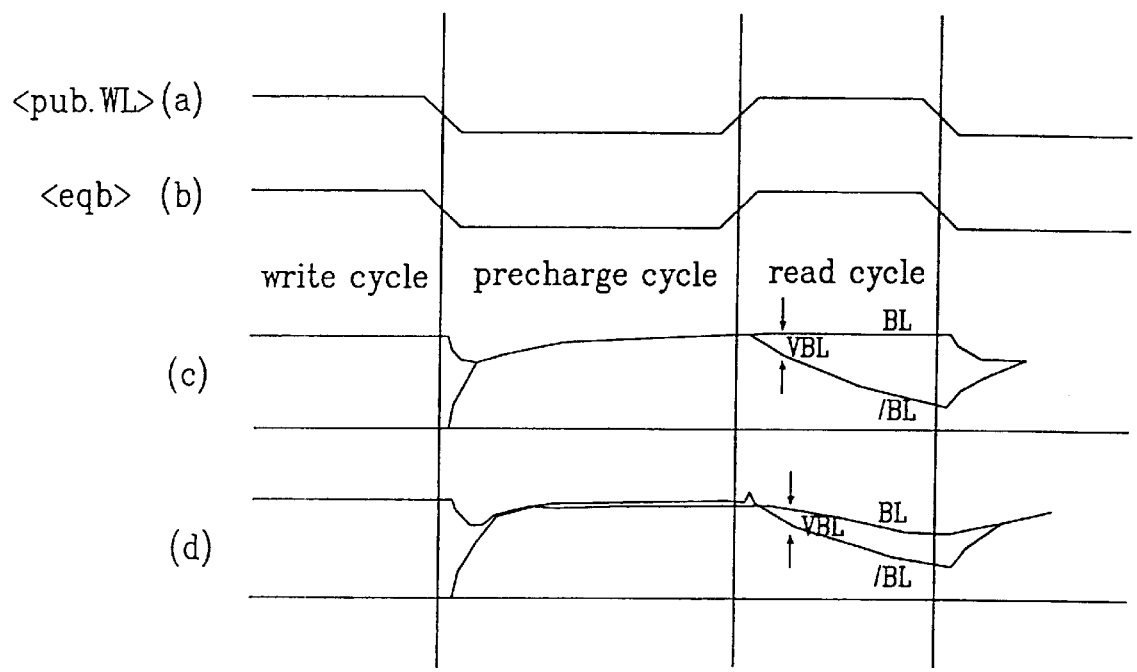
FIG. 3 illustrates waveforms of control signals applied to the related art bitline pull-up circuit, and waveforms of a bitline in respective operation cycles in the related art bitline pullup circuit.

Since swb is at a high level (sw is of course at a low level, accordingly), and compb and eqb are at low levels, at the time T2, to turn the PMOS transistors P5 and P5B, and the NMOS transistors N1 and N1B, switching means, off, and to put the equalizing PMOS transistor P6 and the PMOS transistors P3 and P3B in the leakage current compensation control part 13 into operation, making the leakage current storing part 14 to maintain storage of the leakage current, and compensating leakage current from the bitlines BL and $\overline{BL}$ as, after the bitlines BL and $\overline{BL}$ are equalized, the leakage current compensation part 12 is operated according to an amount of leakage current stored in the leakage current storing part 14 to supply currents to the bitlines BL and $\overline{BL}$, to compensate the leakage current in a reading cycle, the voltage difference VBL between the bitlines BL and $\overline{BL}$ becomes great as shown in FIG. 4 the same as an ideal case of FIG. 3.

As has been explained above, since the bitline pull-up circuit for compensating a leakage current of the present invention can fully compensates a leakage current from a bitline, the problems of the delay time, or the malfunction of a circuit caused by a leakage current become the greater as the threshold voltage Vth is the lower in a device operative at a power source voltage of around 1V are solved, the bitline pull-up circuit for compensating a leakage current of the present invention is very useful for semiconductors for mobile stations operative at a low power.

It will be apparent to those skilled in the art that various modifications and variations can be made in the bitline pull-up circuit for compensating a leakage current of the present invention without departing from the spirit or scope of the invention. Thus, it is intended that the present invention cover the modifications and variations of this invention provided they come within the scope of the appended claims and their equivalents.

What is claimed is:

1. A bitline pull-up circuit for compensating a leakage current, having one pair of bitline pull-up transistors and one bitline equalizing transistor, the bitline pull-up circuit comprising:

a leakage current sensing part having ends respectively connected to a bitline and the pull-up transistors;

a leakage current compensating part having ends connected to the bitline;

a leakage current compensation control part connected to the leakage current compensating part and a first power source, for controlling power supply to the leakage current compensating part; and a leakage current storing part connected to a control terminal of the leakage current compensating part and a second power source for storing a leakage current from the bitline and controlling the leakage current compensating part according to an amount of a stored leakage current.

2. The bitline pull-up circuit as claimed in claim 1, wherein the leakage current sensing part includes a PMOS transistor having a source connected to the bitline pull-up transistor, and a gate and a drain connected to each other.

3. The bitline pull-up circuit as claimed in claim 1, wherein the leakage current sensing part comes into operation for sensing an amount of each of the one pair of the bitlines for a precharge cycle during a period operation of the equalizing transistor is stopped after the one pair of bitlines are equalized.

4. The bitline pull-up circuit as claimed in claim 1, wherein the leakage current compensation control part includes PMOS transistors operative in response to an external signal compb applied to the gate.

5. The bitline pull-up circuit as claimed in claim 1, wherein the leakage current compensation control part controls to cut off power supply to the leakage current compensating part while the leakage current sensing part is in operation during a precharge cycle.

6. The bitline pull-up circuit as claimed in claim 1, wherein the leakage current compensating part includes one pair of PMOS transistors for being controlled by the amount of leakage current stored in the leakage current storing part during a power is supplied through the leakage current circuit control part, for compensating the leakage current from the bitline.

7. The bitline pull-up circuit as claimed in claim 1, wherein the leakage current storing part includes capacitor means for storing the amount of leakage current from the bitline sensed at the sensing part under the control of the leakage current storing control part.

8. The bitline pull-up circuit as claimed in claim 7, wherein the capacitor means includes an NMOS transistor having a drain and a source connected to the second power source in common, a gate connected both to the leakage current compensation part, and the leakage current storing control part.

9. The bitline pull-up circuit as claimed in claim 1, further comprising a leakage current storing control part for controlling connection between the bitline and the leakage current storing part.

10. The bitline pull-up circuit as claimed in claim 9, wherein the leakage current storing control part controls to store the amount of leakage current from the bitline sensed by external control signals in the leakage current storing part.

11. The bitline pull-up circuit as claimed in claim 9, wherein the leakage current storing control part includes NMOS, and PMOS transistors each having a drain and a source connected to the leakage current storing part, and the bitline in common, and a gate with an external control signal applied thereto.

12. The bitline pull-up circuit as claimed in claim 1, wherein the first power source has a voltage, and the second power source has a ground voltage.

* * * * *